United States Patent
Ahn et al.

(10) Patent No.: US 6,522,385 B2
(45) Date of Patent: Feb. 18, 2003

(54) AIR SHOWER HEAD OF PHOTOLITHOGRAPHY EQUIPMENT FOR DIRECTING AIR TOWARDS A WAFER STAGE

(75) Inventors: Yo-Han Ahn, Yongin-si (KR); Byung-Moo Lee, Yongin-si (KR); Hyun-Joon Kim, Yongin-si (KR); Jai-Heung Choi, Yongin-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/848,284

(22) Filed: May 4, 2001

(65) Prior Publication Data
US 2001/0048510 A1 Dec. 6, 2001

(30) Foreign Application Priority Data
May 29, 2000 (KR) ......................................... 2000-28972

(51) Int. Cl.⁷ .................. G03B 27/52; G03B 27/42; G03B 27/58; G01B 9/02; A61N 5/00
(52) U.S. Cl. ............................... 355/30; 355/53; 355/72; 356/345; 356/363; 250/492.2; 250/548
(58) Field of Search ...................... 355/30, 53, 72; 356/345, 363; 250/492.2, 548

(56) References Cited

U.S. PATENT DOCUMENTS

| | | | | |
|---|---|---|---|---|
| 5,685,895 A | * | 11/1997 | Hagiwara et al. | |
| 5,825,470 A | * | 10/1998 | Miyai et al. | |
| 5,958,268 A | * | 9/1999 | Engelsberg | |
| 5,963,324 A | | 10/1999 | Murata | |
| 6,054,181 A | * | 4/2000 | Nanbu et al. | |
| 6,394,109 B1 | * | 5/2002 | Somekh | |

FOREIGN PATENT DOCUMENTS

JP 9-283401 10/1997

* cited by examiner

*Primary Examiner*—Russell Adams
*Assistant Examiner*—Khaled Brown
(74) *Attorney, Agent, or Firm*—Volentine Francos, PLLC

(57) ABSTRACT

An air shower head of an exposure device of photolithography equipment is free of chemical substances that could otherwise contaminate a photoresist layer on a semiconductor wafer and degrade the profile of the photoresist pattern. The air shower head is interposed between a lens system of the exposure device and a wafer stage, and has a hole in the middle thereof through which exposure light can pass to a wafer supported on the stage. The air shower head includes an upper frame defining a cavity open at the bottom thereof, and a porous bottom member covering the bottom of the upper frame. The porous member is mechanically secured to bottom ends of both the inner and outer side walls of the upper frame, i.e., without the use of chemical binders, to reduce the ability of the air shower head to serve as a source of contamination.

26 Claims, 8 Drawing Sheets

AIR SHOWER HEAD OF PHOTOLITHOGRAPHY EQUIPMENT FOR DIRECTING AIR TOWARDS A WAFER STAGE

BACKGROUND OF THE INVENTION

1. Field of the Invention

The present invention relates to an exposure device used in the manufacturing of semiconductor devices. More particularly, the present invention relates to an air shower head for producing a shower of air that envelops a wafer during a semiconductor device manufacturing process of exposing photosensitive material on the wafer.

2. Description of the Related Art

Impurities are precisely regulated and are injected into small regions of a silicon substrate to manufacture a fine circuit. Such regions are mutually connected to form a device and a VLSI circuit. A pattern formed by photolithography is used to define the regions. That is, a wafer is coated with a photosensitive resist (photoresist layer), the photoresist layer is irradiated with light (ultraviolet light) projected through a photomask bearing a pattern to thereby expose selected portions of the photoresist layer, and the photoresist layer is then developed. The developing of the photoresist comprises removing the exposed or unexposed portions thereof to produce a photoresist pattern having a form identical to or opposite to that of the pattern of the photomask.

The photoresist protects the substrate in the process of forming a semiconductor device or semiconductor chip. In addition, the substrate is processed, e.g., by chemical and physical deposition and plasma etching, using the photoresist pattern as a mask.

An example of a device for performing the above-described photolithography process is disclosed in U.S. Pat. No. 5,963,324.

The technology of photolithography has been regarded as one of the essential technologies in the manufacturing of semiconductor devices. Recently, high degrees of integration characterized by design rules of less than 0.25 microns have been achieved in semiconductor devices. The processes of manufacturing semiconductor devices must, therefore, have characteristics suitable for accomplishing such high degrees of integration.

However, among the characteristics of semiconductor manufacturing processes, air quality, i.e., contamination in the environment in which the processes are carried out, has been a problem. In particular, in photolithography, a chemical such as ammonia or amine reacts with the compound of the resist that is to be activated by the ultraviolet light and thereby prevents such a reaction from taking place, that is, prevents the resist from being exposed during photolithography. A method of passing air through a chemical filter, producing a shower of the air in the vicinity of a lens of the photolithography equipment, and directing the air towards the wafer has been suggested as a means for preventing such chemicals from contaminating the wafer (see Japanese Patent Laid-Open Pub. No. Hei 9-283401).

More specifically, an air shower head is provided in the vicinity of a lens of the exposure device. Clean air is supplied by the air shower head around the wafer to prevent the wafer from being contaminated.

FIG. 1 shows a prior art air circulation system for supplying air into an exposure device. Referring to FIG. 1, cooling water is supplied to one side of an air conditioning device 10 through a cooling water line 12. Air, on the other hand, is supplied to the other side of the air conditioning device 10 through an air circulation line 50. The air supplied to the air conditioning device 10 through the air circulation line 50 undergoes a heat exchange with the cooling water, and is then supplied to a filtering device 20. Chemicals are filtered out of the air by the filtering device 20. The filtered air is then supplied to an air distributing device 30 comprising first, second, and third air supplying lines 50a, 50b, and 50c.

Some of the air is supplied to the exposure device (not shown) via the first supplying line 50a of the air distributing device 30. The air traveling through the second supplying line 50b passes through a first filter 32 in which particulates in the air are filtered, and then is supplied to a wafer orienting stage or a wafer feeding system. The remainder of the air travels through the third supplying line 50c and from there passes through a heat exchanger 36 and a second filter 34, whereby the temperature of the humidity of the air are regulated. This portion of the air is supplied to an air shower head disposed above a wafer stage of the exposure device.

Referring to FIGS. 2 and 3, the air shower head 100 is disposed under a lens system 140 of the exposure device. More specifically, the air shower head 100 is interposed between a wafer (not shown) and the lens system 140 of the exposure device. The air shower head 100 comprises an upper frame 120 and a porous member bottom 130 attached to the bottom of the upper frame 120.

The upper frame 120 has an upper wall 126, an inner side wall 124 and an outer side wall 128. The inner side wall 124 defines a concavity in the top of the shower head 100, and the upper side wall 126 defines a flat (horizontal) surface at the periphery of the concavity. The air shower head 100 also has a hole 122 extending through the center of both the upper frame 120 and porous member 130 and by which light transmitted through the lens system 140 can propagate to the wafer. The inner side wall 124 together with the porous member 130 form a tapered portion of the air shower head 100 at an intermediate portion thereof as taken in the radial direction. That is, the thickness of the air shower head 100 increases radially outwardly from the hole 122 to the flat surface defined by the upper wall 126. The shower head 100 is hollow, i.e., a space therein is delimited by the porous member 130 and the upper wall 126 and side walls 124,128 of the frame 120.

Referring now to FIGS. 3 and 4, the bottom end 128a of the side wall 128 of the upper frame 120 is bonded to the porous member 130. Similarly, the bottom end 122a of the side wall 124 is bonded at the penphery of the hole 122a to the porous member 130.

The porous member 130 is made of a woven fabric comprising chemical resistant yarn. The yarn is woven in the form of a matrix leaving a plurality of fine holes between individual ones of the yarns. FIG. 4 shows the state in which the bottom end 122a of the side wall 124 of the frame 120 is bonded to the porous member 130 at the periphery of the central hole of the shower head. Specifically, the porous member 130 is attached to the frame 120 using a chemical binder 110.

The third air supplying line 50c shown in FIG. 1 is connected to one side of the air shower head 100 so that air is supplied into the air shower head 100. The air is injected through the fine holes of the porous member 130 towards the upper surface of the wafer. Thus, a higher pressure is created in the region of the wafer stage than in the surrounding region. As a result, foreign matter is prevented from being introduced onto the wafer from the surrounding region.

However, the air shower head produces organic contaminants during the manufacturing (photolithography) process. Specifically, organic contaminants are continuously produced in the form of a gas from the binder which is used to bond the upper frame 120 to the porous member 130. Furthermore, the yarn of the porous member is engaged with the upper frame of the air shower head. Thus, the yarn separates into particles or fibers which adhere to the wafer and thereby contaminate the photoresist film.

The present inventors have confirmed, as follows, that the air shower head of the prior art is a source of contamination for a wafer undergoing photolithography. Using the air supply system of FIG. 1, air supplied to a wafer stage of an exposure device through the third air supplying line 50c and the prior art air shower head was retrieved and supplied to a first bare wafer. Air supplied to a wafer feeding system through the second air supplying line 50b, i.e., without passing through an air shower head, was retrieved and supplied to a second bare wafer.

The bare wafers were cleaned, using a fluoride solution and a standard cleaning solution, before the air was supplied thereto. The respective portions of air were supplied to the bare wafers for four hours. FTIR by the wafers were measured to analyze the organic substances which were present on the wafers. FIG. 5 shows the presence on the first and second bare wafers of organic substances having C—H bonds, whereas FIG. 6 shows the presence on the first and second wafers of organic substances having C—X (wherein X is a halogen), S=O, C—N bonds.

In FIGS. 5 and 6, the dotted lines represent a measure of contaminants on the first bare wafer, and the solid lines represent a measure of contaminants on the second bare wafer. Accordingly, FIGS. 5 and 6 clearly prove that the air retrieved from the wafer feeding system is less contaminated than the air retrieved from the wafer stage after having passed through the prior art shower head. Examples of the organic substances, that is the contaminants, are 1-buthanol, 3-methyl 1-heptene, 4-methyl 1,6-dioxasiclorodekan-7, 12-dion2-heptene, 3-methyl 2-penthanol, 2-penthanon, 4-methyl 2-propanol, 1-metoxy propion acid, trimethyl-2, 4,4 hexane-1 and chlorine. These contaminants corrode the equipment, and produce haze on the surface of the lens, thereby lowering the intensity of the light transmitted therethrough onto the photoresist film. Furthermore, the organic substances react with the photo-activatable compounds of the photoresist film and inhibit the forming of patterns thereon by the light, i.e., render the compounds inactive.

SUMMARY OF THE INVENTION

An object of the present invention is to solve the above-described problem of the prior art by providing an air shower which will not serve as a source of contamination and will not act to degrade the profile of a wafer that has undergone photolithography while showered with air by the air shower head.

In order to achieve the above-mentioned object, the present invention provides an air shower head of photolithography equipment, in which the porous bottom member is mechanically clamped to the upper frame instead of being chemically bound thereto.

Specifically, the inner and outer circumferential side walls of the upper frame each have U-shaped portions at the bottom ends thereof. The inner and outer circumferential ends of the porous bottom member extend into the U-shaped portions, respectively, and are crimped thereby.

Alternatively, discrete clamps secure the inner and outer circumferential ends of the porous bottom member to peripheral portions of the bottom ends of the inner and outer circumferential side walls of the upper frame.

According to the present invention, because the air shower head does not comprise a chemical binder, the photoresist film on the wafer will not be contaminated by organic materials which can render the photo-activatable compound thereof inactive, and the lens will not become hazy due to organic substances. Accordingly, a high quality photoresist pattern can be produced when the air shower head of the present invention is employed.

BRIEF DESCRIPTION OF THE DRAWINGS

The above and other objects, features and advantages of the present invention will become more apparent by referring to the following detailed description of the preferred embodiments thereof made in conjunction with the accompanying drawings, of which.

DETAILED DESCRIPTION OF THE PREFERRED EMBODIMENTS

The present invention will be described in detail hereinafter with reference to the attached drawings.

Figure 7:
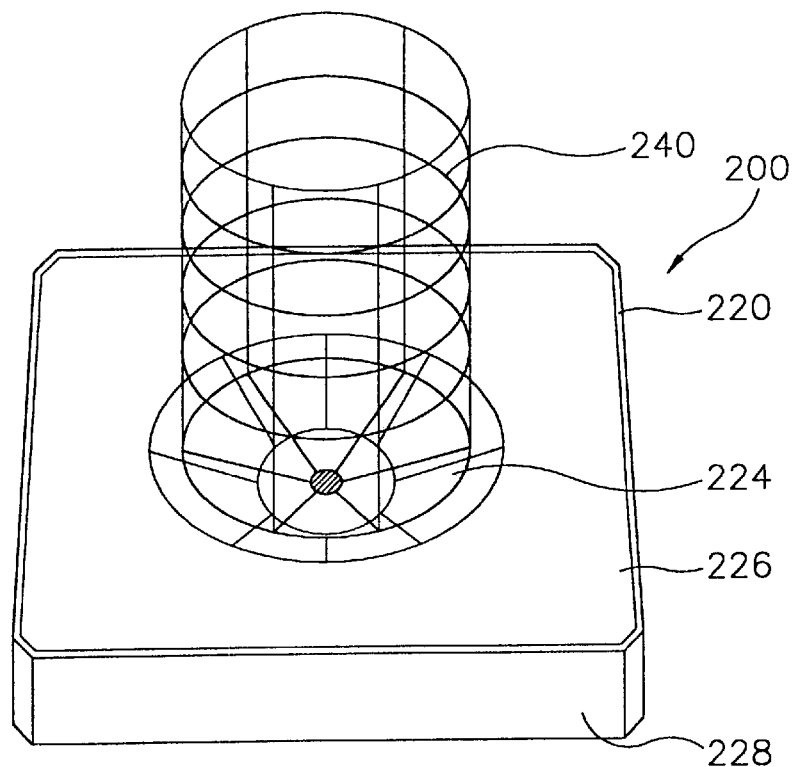
FIG. 7 is a perspective view of a lens system and an embodiment of an air shower head of an exposure device according to the present invention.
Figure 8:
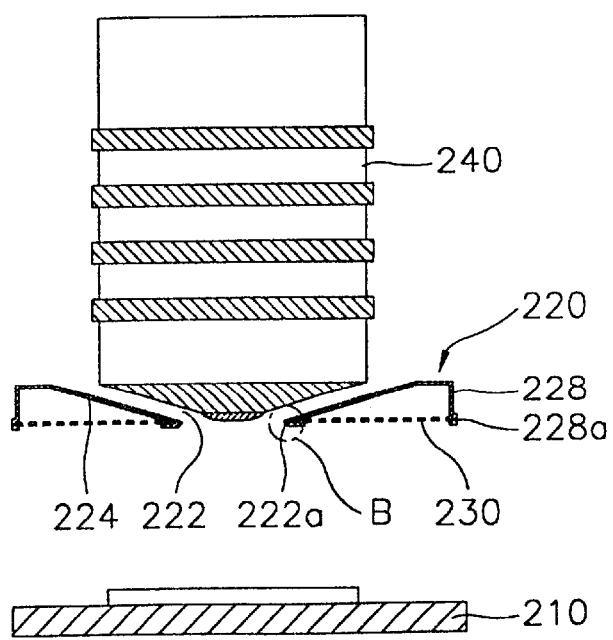
FIG. 8 is a side view, partially in section, of photolithography equipment comprising the lens system, wafer stage and air shower head according to the present invention.

As shown in FIGS. 7 and 8, the air shower head 200 is provided between a wafer stage 210 and a lens system 240, namely an optical system comprising a lens, of an exposure device. The air shower head 200 has an annular upper frame 220 and a porous annular bottom member 230 attached to the bottom of the frame 220.

The upper frame 220 includes an inner circumferential side wall 224, an upper wall 226, and an outer circumferential side wall 228, which together delimit a cavity open at the bottom of the frame 220. The inner circumferential side wall 224 defines a concavity in the top of the frame 220, and the upper wall 226 defines a flat (horizontal) surface at the periphery of the concavity. The air shower head 200 also has a hole 222 extending through the center thereof, i.e. both the upper frame 220 and porous bottom member 230 define the central hole by which light transmitted through the lens system 240 can propagate to the wafer.

The inner circumferential side wall 224 has a frusto-conical shape, sloping downwardly radially inwardly towards the hole 222. The inner circumferential side wall 224 together with the porous member 230 thus form a tapered portion of the air shower head at a intermediate portion thereof as taken in the radial direction. Accordingly, the thickness of the air shower head 200 increases radially outwardly from the hole 222 to the flat surface defined by the upper wall 226. The interior of the shower head 200 is open, i.e., a space exists therein as delimited by the porous bottom member 230 and the upper frame 220.

The porous bottom member 230 is made of a woven fabric comprising chemical resistant yarn. The yarn is woven in the form of a matrix leaving a plurality of fine holes between individual ones of the yarns. Alternatively, the porous member 230 is made of a chemical-resistant metal such as gold or platinum. In this case, the porous member may comprise a plate made of the chemical-resistant metal in which fine holes have been punched or a metallic cloth finely woven from yarn made of the chemical-resistant metal.

Figure 9:
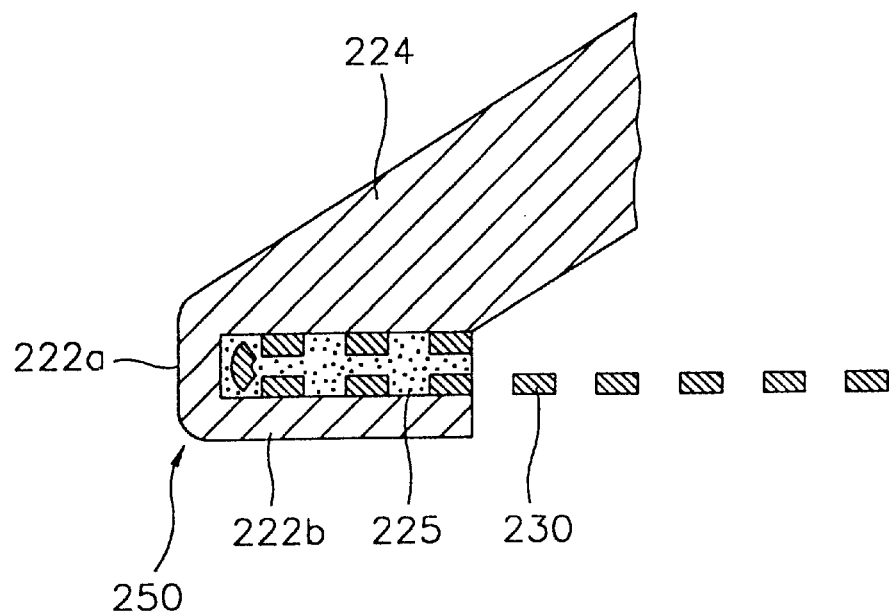
FIG. 9 is an enlarged view of a portion B of the shower head shown in FIG. 8.

Referring now to FIGS. 8 and 9, the bottom end 228a of the outer side wall 228 of the upper frame 220 is engaged with the porous member 230. The bottom end 222a of the inner side wall 224 is mechanically clamped to (physically engaged with) the porous member 130 at the periphery of the hole 222. More specifically, as shown best in FIG. 9, the bottom end 222a of the inner side wall 224 is clamped by an engaging member 250 to the porous member 230 at the periphery of the central through-hole 222 of the air shower head.

The engaging member 250 comprises a bent portion 222b of the inner side wall 224 at the bottom end 222a thereof, i.e., at the bottom of the concavity 224. The bent portion 222b is U-shaped and opens in a direction towards the outer side wall 228, that is toward the interior of the air shower head. A second U-shaped bent portion 228b (FIG. 8) similar to the first bent portion 222b is formed at the bottom end 228a of the side wall 228 of the frame 220 as open towards the bottom end 222a of the inner side wall 224.

The porous member 230 is inserted into and fixed to the first and second bent portions 222b and 228b. Specifically, the radially innermost and outermost circumferential ends of the porous member 230 are each folded over by amounts equal to no more than the lengths of the first and second bending portions 222b and 228b, respectively. Alternatively, the ends of the porous member 230 can be left as they are, i.e., in an unfolded state. Then, the ends of the porous member 230 are inserted into and crimped by the first and second bent portions 222b and 228b, respectively, to prevent the yarn particles from separating from the ends of the porous member 230.

A respective silicon sealing member 225 can be provided between the porous member 230 and each of the first and second bent portions 222b and 228b so as to provide seals therebetween. The silicon of the sealing members 225 is chemically stable and produce little organic material.

Figure 1:
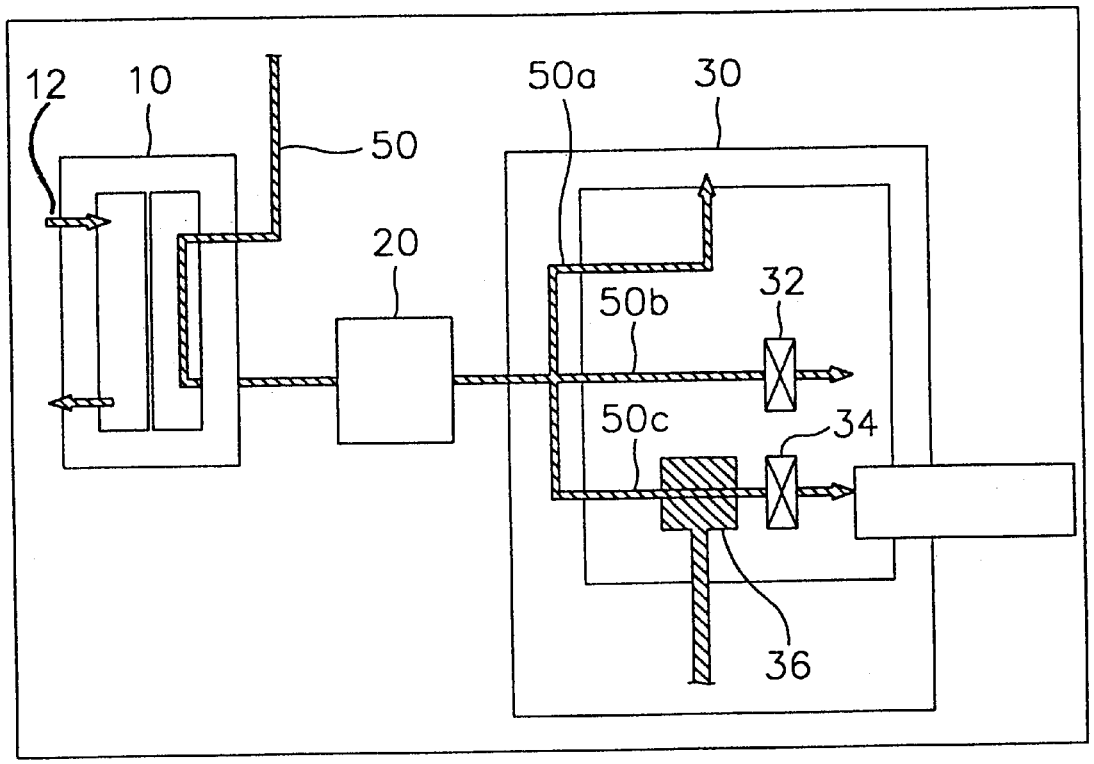
FIG. 1 is a schematic diagram of a prior art air circulation system for supplying air to an exposure device.
Figure 2:
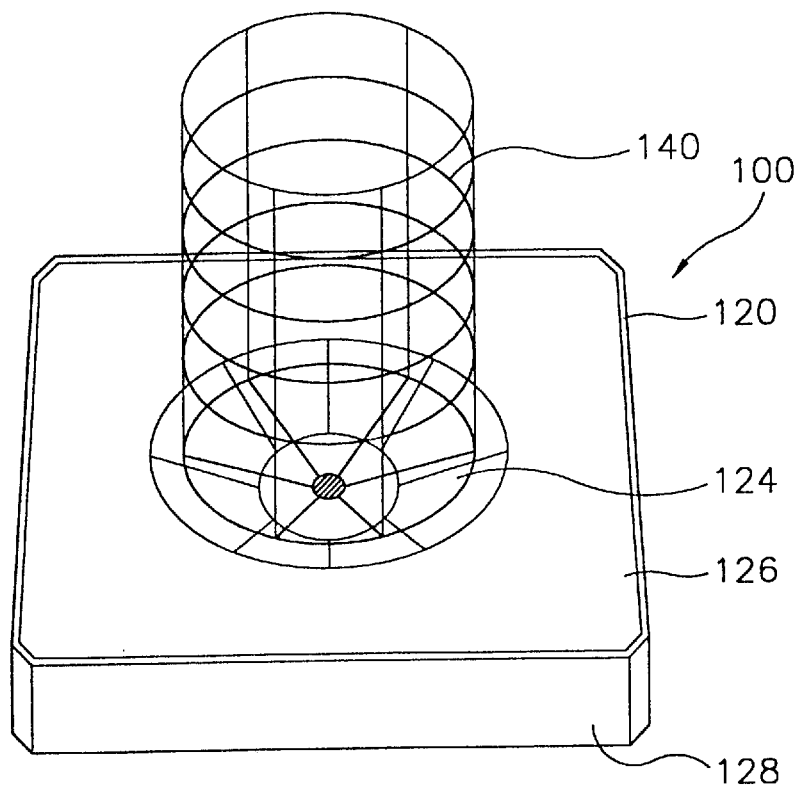
FIG. 2 is a perspective view of a lens system and an air shower head of the prior art exposure device.
Figure 3:
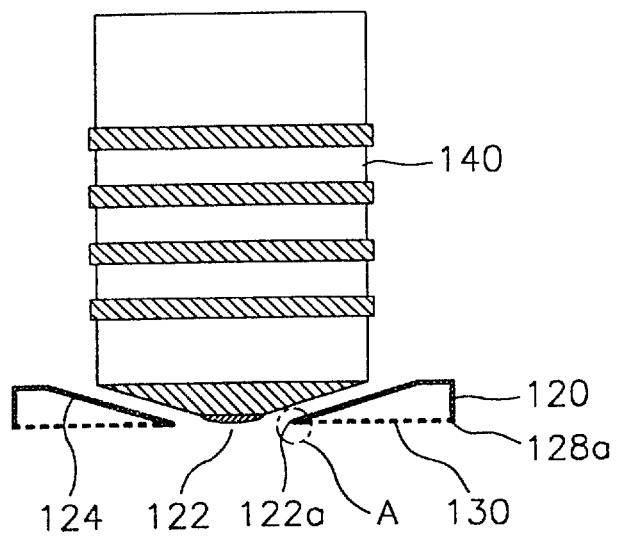
FIG. 3 is a side view, partially in section, of the lens system and air shower head of the prior art exposure device.
Figure 4:
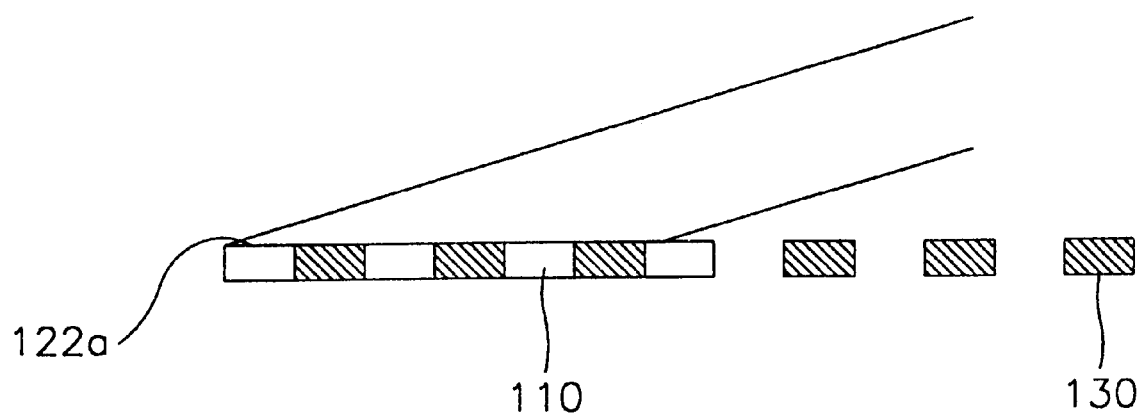
FIG. 4 is an enlarged view of a portion A of the prior art shower head shown in FIG. 3.
Figure 5:
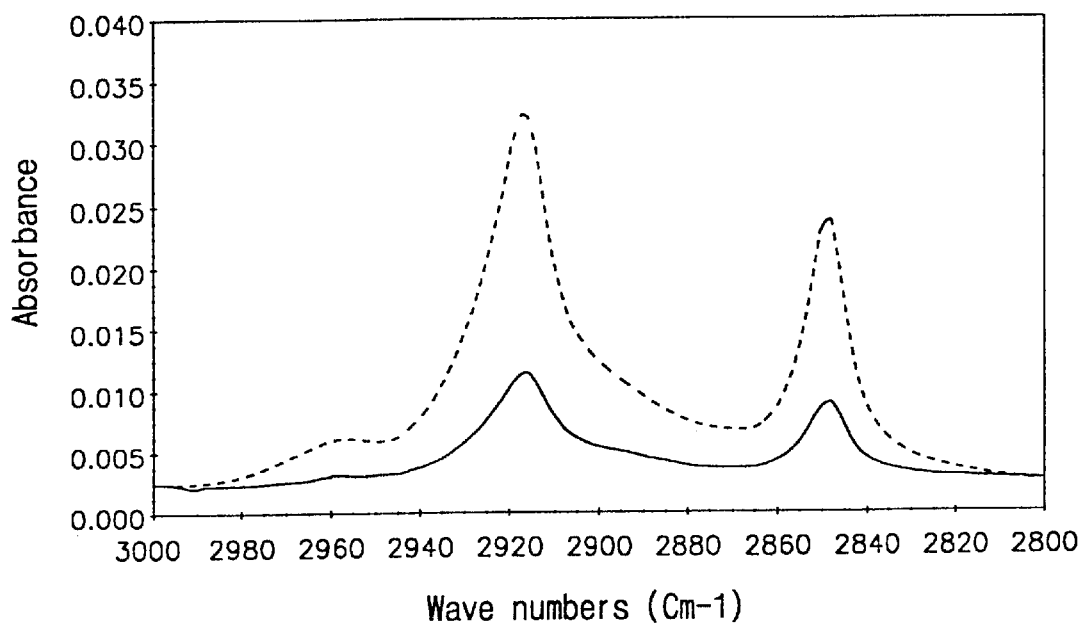
FIG. 5 is a graph showing the presence of organic substances having C—H bonds on bare wafers as the result of an experiment used to confirm the prior art air shower head as a source of contamination.
Figure 6:
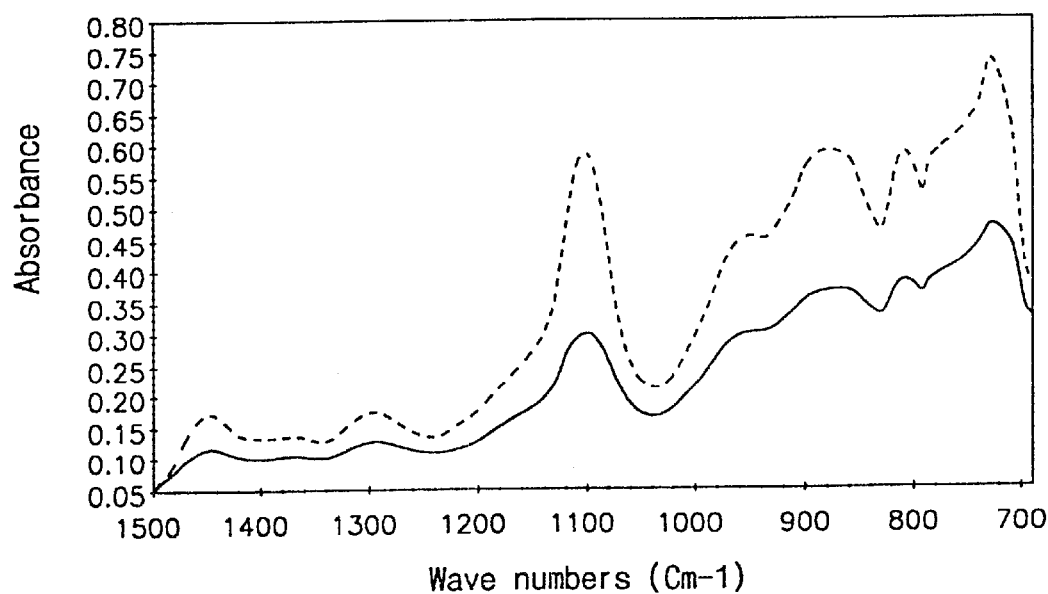
FIG. 6 is a graph showing the presence of organic substances having C—X (wherein X is a halogen), S=O, and C—N bonds on bare wafers as the result of an experiment used to confirm the prior art air shower head as a source of contamination.

An air supplying line 50c of the type shown in FIG. 1 is connected to one side of the air shower head 200 so that air is supplied into the air shower head 200. The air is injected through the fine holes of the porous member 230 towards the upper surface of the wafer. Thus, a higher pressure is created in the region of the wafer stage than in the surrounding region. As a result, foreign matter is prevented from being introduced onto the wafer from the surrounding region.

According to the preferred embodiment as described above, a free end(s) of the porous member is folded over and extends within a U-shaped portion of the engaging member. Thus, the end(s) of the porous member will not produce particles of yarn that will be free to contaminate the wafer.

FIGS. 10A to 10D show engaging members of other embodiments of the air shower head according to the present invention. In these embodiments the engaging member comprises a discrete clamp 255. The body of the clamp 255 has a shape corresponding to that of the bottom end 222a, i.e. of the peripheral portion, of the frame 220. The end of the porous member 230 is fixed between the body of the clamp 255 and the peripheral portion of the frame.

Figure 10A:
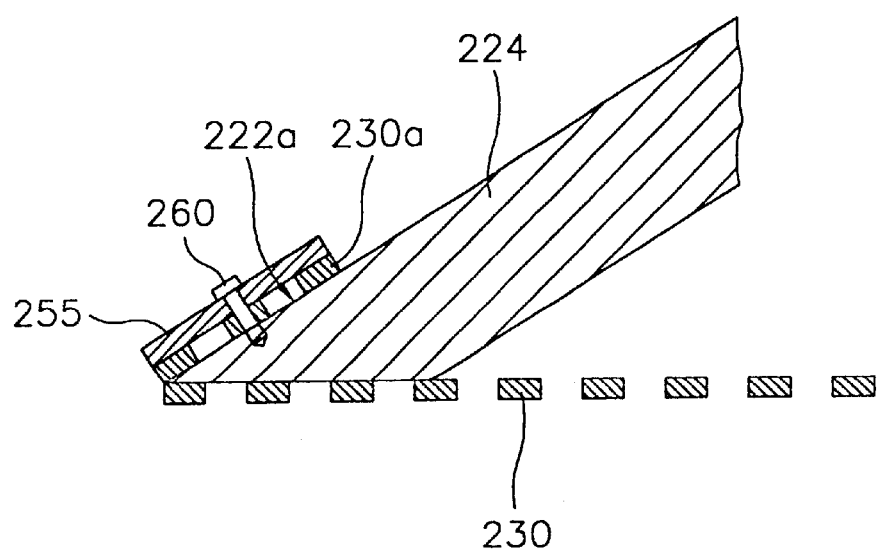
FIGS. 10A to 10D are enlarged views of the same portion B but of other embodiments of the air shower head according to the present invention.

In the embodiment shown in FIG. 10A, the clamp 255 is provided over the inner side surface of the bottom end 222a of the frame 220. The end portion 230a of the porous member 230 extends along the peripheral portion of the bottom end 222a of the inner circumferential side wall 224 of the upper frame 220, outside the cavity in the upper frame 220 and within a space defined between the clamp 255 and the peripheral portion.

Figure 10B:
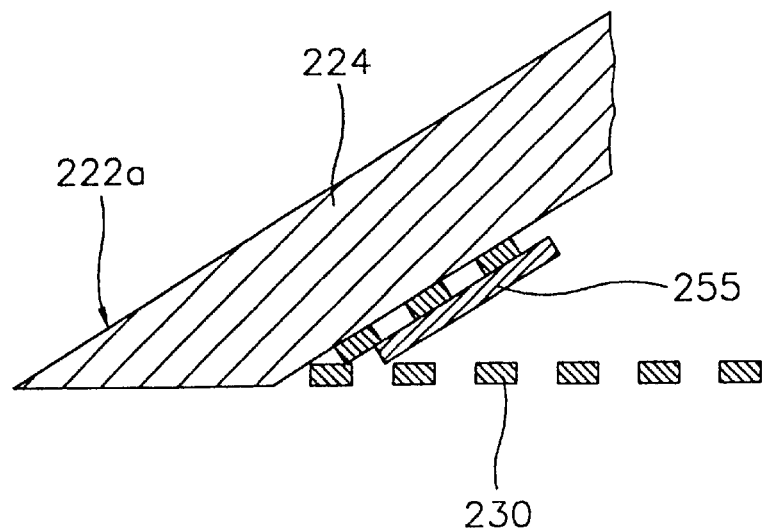

In the embodiment shown in FIG. 10B, the clamp 255 is provided over the outer side surface of the bottom end 222a of the frame 220. The end portion 230a of the porous member 230 extends along the peripheral portion of the bottom end 222a of the inner circumferential side wall 224 of the upper frame 220, inside the upper frame 220 and within a space defined between the clamp 255 and the peripheral portion.

Figure 10C:
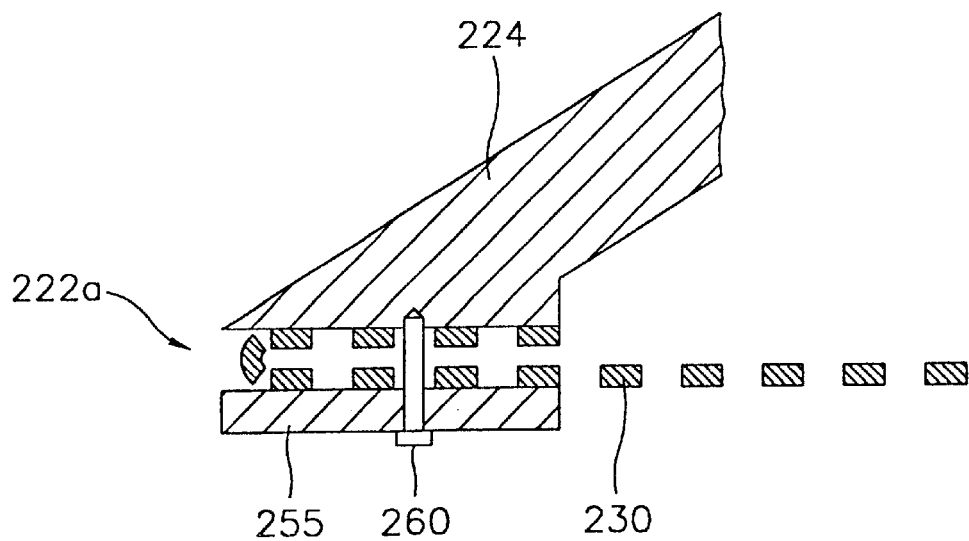
Figure 10D:
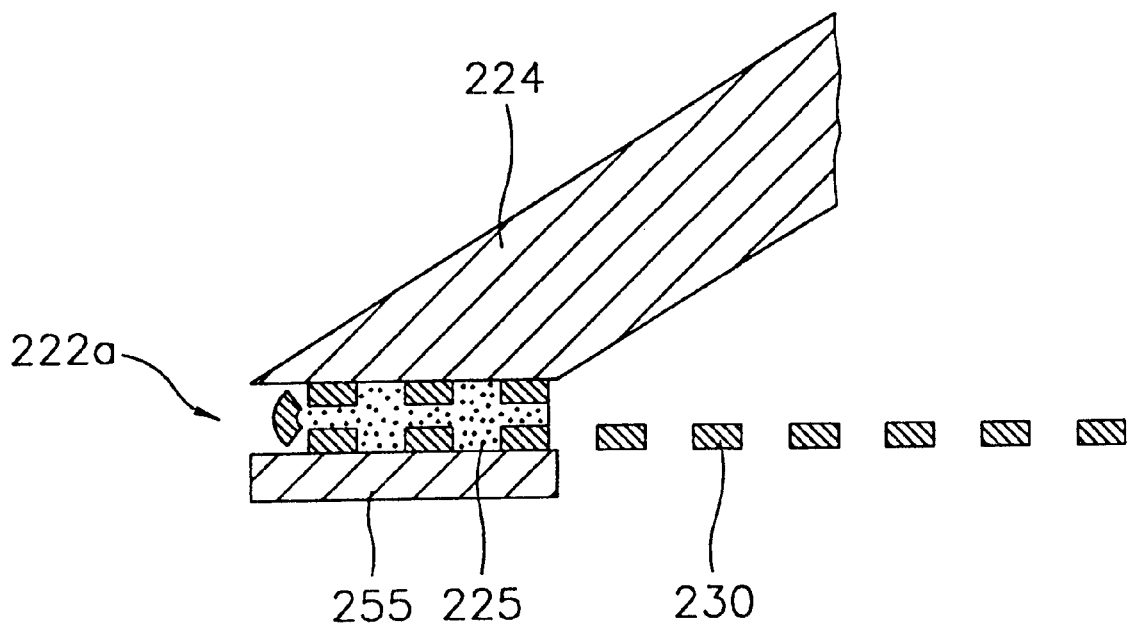

In the embodiment of the present invention shown in FIG. 10C, the clamp 255 is provided over the bottommost surface of the bottom end 222a of the frame 220. The end portion 230a of the porous member 230 is folded over itself. The folded end portion 230a of the porous member 230 extends along the bottommost surface of the bottom end 222a of the frame 220, within a space defined between the clamp. 255 and the bottom end 222a. A chemically stable silicon sealing member 225 fills the fine pores in the end portion of the porous member 230 sandwiched between the clamp 255 and the bottom end 222a of the frame.

The clamp 255 can comprise a fastener(s) for fixing the body of the clamp to the frame 220. As shown in FIGS. 10A to 10C, the fastener(s) may comprise screws 260 or rivets.

Also, although FIGS. 10A to 10D each show only the inner circumferential portion of the porous member 230 fixed by a clamp 255 to the bottom end 222a of the inner side wall 224 of the frame, the outer circumferential portion of the porous member 230 is clamped to the bottom end 228a of the outer side wall 228 of the frame in the same manner.

According to the present invention, the porous bottom member 230 of the air shower head is physically secured to the upper frame 220 without using a chemical binder. Therefore, the wafer below the air shower head will not be contaminated by organic substances that are continuously discharged from chemical binders. In addition, the present invention does not produce particulate contaminants and thus, the lens of the optical system of the exposure device will not become hazy during photolithography. Accordingly, the photoresist film on the wafer will be properly developed by light projected through the lens.

Although the present invention has been shown and described above in connection with the preferred embodiments thereof, various changes thereto and modifications thereof will become apparent to those skilled in the art. Therefore, all such changes and modifications are seen to be within the true spirit and scope of the present invention as hereinafter claimed.

What is claimed is:

1. An air shower head for use in showering a wafer stage with air, said air shower head comprising:
   an annular upper frame defining a hole at the center thereof, and a cavity open at the bottom thereof, said annular upper frame comprising an inner circumferential side wall and an outer circumferential side wall that delimit said cavity, said circumferential inner side wall having a frusto-conical shape and sloping downwardly radially inwardly towards said annular bole so as to define a concavity in the top of the annular upper frame, the thickness of said air shower head becoming greater while moving radially outwardly from a radially innermost end of the inner circumferential side wall of said annular upper frame to a radially outermost end of said inner circumferential side wall; and
   an annular bottom member mechanically clamped in place at the bottom of said annular upper frame covering said cavity in the annular upper frame, said annular bottom member defining a plurality of pores extending therethrough, when said annular upper frame and said annular bottom member define a space within the air shower head open to said pores so that air introduced into said space under pressure is ejected out of the air shower head through said pores.

2. An air shower head for a wafer stage according to claim 1, wherein the annular bottom member is a fabric of woven yarn.

3. An air shower head for a wafer stage according to claim 2, wherein at least one of said inner and outer circumferential side walls of said annular upper frame has a U-shaped portion at the bottom thereof, the U-shaped portion opening in a direction towards the other of said inner and outer circumferential side walls, one circumferential side of said bottom member extending into and crimped by said U-shaped portion.

4. An air shower head for a wafer stage according to claim 2, wherein the air shower head comprises a discrete clamp comprising a clamp body having a shape corresponding to that of a peripheral portion of the bottom of one of said inner and outer circumferential side walls of said annular upper frame, one circumferential side of said bottom member extending between said clamp body and said peripheral portion and clamped by said clamp against the bottom of said one of the inner and outer circumferential side walls of said annular upper frame.

5. An air shower head for a wafer stage according to claim 4, wherein said peripheral portion is located outside of said cavity of the annular upper frame such that said one circumferential side of said bottom member extends along said peripheral portion of the bottom of said annular upper frame outside of said cavity.

6. An air shower head for a wafer stage according to claim 4, wherein said peripheral portion is located at the inside of the annular upper frame such that said one circumferential side of said bottom member extends along said peripheral portion of the bottom of said annular upper frame inside said cavity.

7. An air shower head for a wafer stage according to claim 4, wherein said peripheral portion is the bottommost surface of said one of the inner and outer circumferential side walls of the annular upper frame such that said one circumferential side of said annular bottom member extends along the bottommost surface of said one of the inner and outer circumferential side walls.

8. An air shower head for a wafer stage according to claim 7, wherein said one circumferential side of said annular bottom member is folded over on itself.

9. An air shower head for a wafer stage according to claim 4, wherein said clamp further comprises at least one mechanical fastener fixing the clamp body to said annular upper frame.

10. An air shower head for a wafer stage according to claim 9, wherein said mechanical fastener is a screw or a rivet.

11. An air shower head for a wafer stage according to claim 1, and further comprising at least one silicon member providing a seal between said annular bottom member and said annular upper frame.

12. An air shower head for a wafer stage according to claim 1, wherein the annular bottom member comprises a chemical-resistant metal.

13. An air shower head for a wafer stage according to claim 12, wherein the chemical-resistant metal is gold or platinum.

14. Photolithography equipment for use in exposing a photoresist layer formed on a semiconductor substrate, the equipment comprising:
   a wafer stage on which the wafer is supported during exposure of the photoresist layer;
   an optical system comprising a lens disposed above said wafer stage; and
   an air shower bead interposed between said optical system and said wafer stage for use in showering the wafer stage with air to prevent foreign material in the area surrounding the wafer stage from contaminating the photoresist layer, said air shower head comprising an annular upper frame, and an annular bottom member,
   said annular upper frame defining a hole at the center thereof, and a cavity open at the bottom thereof, said annular upper frame comprising an inner circumferential side wall and an outer circumferential side wall that delimit said cavity, said inner circumferential side wall hang a frusto-conical shape and sloping downwardly radially inwardly towards said hole so as to define a concavity in the top of he annular upper frame, the thickness of said air shower head becoming greater while moving radially outwardly from a radially innermost end of the inner circumferential side wall of said annular upper frame to a radially outermost end of said inner circumferential side wall, and
   said annular bottom member being mechanically clamped in place at the bottom of said annular upper frame covering said cavity in the annular upper frame, said annular bottom member defining a plurality of pores extending therethrough, wherein said annular upper frame and said annular bottom member define a space within be air shower head open to said pores so that air introduced into said space under pressure is ejected out of the air shower head through said pores toward said wafer stage.

15. Photolithography equipment according to claim 14, wherein the annular bottom member of said air shower head is a fabric of woven yarn.

16. Photolithography equipment according to claim 15, wherein at least one of said inner and outer circumferential side walls of said annular upper frame of the air shower head has a U-shaped portion at the bottom thereof, the U-shaped portion opening in a direction towards the other of said inner and outer circumferential side walls, one circumferential side of said annular bottom member extending into and crimped by said U-shaped portion.

17. Photolithography equipment according to claim 15, wherein the air shower head comprises a discrete clamp comprising a clamp body having a shape corresponding to that of a peripheral portion of the bottom of one of said inner and outer circumferential side walls of said annular upper frame, one circumferential side of said annular bottom member extending between said clamp body and said peripheral portion and clamped by said clamp against the bottom of said one of the inner and outer circumferential side walls of said annular upper frame.

18. Photolithography equipment according to claim 17, wherein said peripheral portion is located outside of said cavity of the annular upper frame such that said one circumferential side of said annular bottom member extends along said peripheral portion of the bottom of said annular upper frame outside of said cavity.

19. Photolithography equipment according to claim 17, wherein said peripheral portion is located at the inside of the annular upper frame such that said one circumferential side of said annular bottom member extends along said peripheral portion of the bottom of said annular upper frame inside said cavity.

20. Photolithography equipment according to claim 17, wherein said peripheral portion is the bottommost surface of said one of the inner and outer circumferential side walls of the annular upper frame such that said one circumferential side of said annular bottom member extends along the bottommost surface of said one of the inner and outer circumferential side walls.

21. Photolithography equipment according to claim 20, wherein said one circumferential side of said annular bottom member is folded over on itself.

22. Photolithography equipment according to claim 17, wherein said clamp further comprises at least one mechanical fastener fixing the clamp body to said annular upper frame.

23. Photolithography equipment according to claim 22, wherein said mechanical fastener is a screw or a rivet.

24. Photolithography equipment according to claim 14, wherein said air shower head further comprises at least one silicon member providing a seal between said annular bottom member and said annular upper frame.

25. Photolithography equipment according to claim 14, wherein the annular bottom member of said air shower head comprises a chemical-resistant metal.

26. Photolithography equipment according to claim 25, wherein the chemical-resistant metal is gold or platinum.

* * * * *